US005895231A

United States Patent [19]

Choi et al.

[11] Patent Number: 5,895,231

[45] Date of Patent: Apr. 20, 1999

[54] EXTERNAL TERMINAL FABRICATION METHOD FOR SEMICONDUCTOR DEVICE PACKAGE

[75] Inventors: Jong Hae Choi; Jin Sung Kim, both of Chungcheongbuk-Do, Rep. of Korea

[73] Assignee: LG Semicon Co., Ltd., Chungcheongbuk-Do, Rep. of Korea

[21] Appl. No.: 08/960,210

[22] Filed: Oct. 29, 1997

[30] Foreign Application Priority Data

Oct. 29, 1996 [KR] Rep. of Korea ........................ 96/49456

[51] Int. Cl.[6] ........................ H01L 21/44; H01L 21/48; H01L 21/50

[52] U.S. Cl. ........................ 438/106; 438/106; 438/108; 438/126; 438/615

[58] Field of Search ........................ 438/106, 108, 438/126, 615

[56] References Cited

U.S. PATENT DOCUMENTS

| | | | |
|---|---|---|---|
| 5,466,635 | 11/1995 | Lyon et al. | 438/615 |
| 5,639,696 | 6/1997 | Liang et al. | 438/108 |
| 5,646,068 | 7/1997 | Wilson et al. | 438/108 |
| 5,733,802 | 3/1998 | Inoue et al. | 438/126 |

OTHER PUBLICATIONS

S. Tostado and P. Hoffman, Olin Interconnect Technologies: "Solder Ball Attach Processing For Metal BGA's"; Published: 1995 IEPS Conference pp. 559–564.

*Primary Examiner*—Kevin M. Picardat
*Assistant Examiner*—Deven Collins
*Attorney, Agent, or Firm*—Morgon, Lewis & Bockius LLP

[57] ABSTRACT

An external terminal fabrication method for a ball grid array (BGA) semiconductor package for directly forming a bump on a substrate includes the steps of forming a plurality of conductive islands spaced from each other on an upper surface of a substrate, forming a photoresist film on the substrate, exposing the respective islands through the photoresist film, forming a conductive bump member on each of the exposed islands, and removing the photoresist film remaining on the substrate.

28 Claims, 5 Drawing Sheets

124 125a 125b 122 1 2

EXTERNAL TERMINAL FABRICATION METHOD FOR SEMICONDUCTOR DEVICE PACKAGE

This application claims the benefit of Application No. 49456/1996, filed in Korea on Oct. 29, 1996, which is hereby incorporated by reference.

BACKGROUND OF THE INVENTION

Field of the Invention

The present invention relates to a semiconductor device package fabrication method, and more particularly to an external terminal fabrication method for a semiconductor device package. Although the present invention has a wide range of applications, it is particularly suitable for a ball grid array (BGA) package.

Discussion of the Related Art

In a conventional BGA package, as shown in FIG. 1, there are provided a plurality of inner leads 2 formed of copper that pass through a substrate 1 to connect the upper and lower surfaces of the substrate 1. A plurality of bonding fingers 2*a* are formed at respective upper portions of the inner leads 2. A die paddle 3 is mounted on the surface of substrate 1. A semiconductor chip 4 is attached on paddle 3 using an adhesive 5. The bonding fingers 2*a* of inner leads 2 are respectively connected to bonding pads on the chip 4 by metal wires 6. Molding unit 7 surrounds the chip 4 and metal wires 6 and covers a certain area on substrate 1 by using an epoxy compound. A plurality of solder balls 8 are attached to the respective copper islands 10 formed on respective lower ends of inner leads 2 at the lower surface of substrate 1 and electrically connected to the chip 4 via the respective inner leads 2 passing through substrate 1.

The conventional BGA package is manufactured by the following steps.

First, a plurality of via holes are formed in a substrate by patterning a thin printed circuit board (PCB) and by punching the patterned portions to fabricate a package substrate. A plurality of PCBs with the via holes formed therethrough are stacked and then the substrate 1 having inner leads 2 therethrough is formed by filling Cu metal into the respective via holes to connect the upper and lower surfaces of substrate 1.

Next, the die paddle 3 on which the adhesive pad 5 is glued is mounted on substrate 1 having inner leads 2 therethrough, and a die bonding is carried out for attaching chip 4 onto adhesive 5. A wire bonding is carried out using metal wires 6 to connect respective bonding pads (not shown) formed on chip 4 with respective bonding fingers 2*a* formed at respective upper ends of inner leads 2. To protect chip 4 and wires 6 from external damage, a molding unit 7 is formed thereover using an epoxy molding compound.

For better adhesion of copper islands 10 and solder balls 8 provided at the lower surface of substrate 1, a flux step is carried out for spreading solder cream on substrate 1.

The position between substrate 1 and a ball mounting device (not shown) is adjusted and solder balls 8 are mounted accordingly. After mounting solder balls 8, solder residue is removed, a reflow step is carried out for leveling the balls, and the surface of the substrate is cleaned using alcohol, acetone or the like to thereby complete the BGA package manufacture.

However, in the conventional BGA package fabrication method, during the ball mounting step for attaching solder balls 8 on the lower surface of substrate 1, it is difficult to align or match the positions between the substrate and the ball mounting device (not shown). Thus, the solder balls are not accurately mounted on desired positions for the copper islands 10 which are on respective lower ends of inner leads 2. Accordingly, a connection fault may occur between inner leads 2 and solder balls (outer leads) 8, or a poor adhesion may result between solder balls 8 and inner leads 2 after ball mounting, thereby resulting in the solder balls becoming detached from the outer leads. Also, an expensive ball mounting device is required which increases the production cost.

Moreover, since a standard diameter for solder balls is 0.76 mm, there is a limit to minimizing the size of the solder balls, and its application has been more difficult in the case of a high density multi-pin structured semiconductor package.

SUMMARY OF THE INVENTION

Accordingly, the present invention is directed to an external terminal fabrication method for a semiconductor device package that substantially obviates one or more of the problems due to limitations and disadvantages of the related art.

An object of the present invention is to provide an external terminal fabrication method for a ball grid array (BGA) package for removing a fault-causing element in a BGA package.

Another object of the present invention is to provide an external terminal fabrication method for a BGA package that can decrease production costs by not requiring expensive ball mounting equipment.

A further object of the present invention is to provide an external terminal fabrication method for a BGA package having an average bump diameter suitable for a multi-pin structured BGA package, where preferably, the average diameter of the bumps is made less than 0.76 mm.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve the above-described objects, there is provided an external terminal fabrication method for a BGA package including the steps of forming a plurality of conductive islands spaced from each other on an upper surface of a substrate, forming a photoresist film on the upper surface of the substrate, exposing the respective islands through the photoresist film, forming a conductive bump member on each of the exposed islands, and removing the photoresist film remaining on the substrate.

To achieve these and other advantages and in accordance with the purpose of the present invention, as embodied and broadly described, the method for fabricating an external terminal for a ball grid array (BGA) semiconductor package, the method includes the steps of forming a plurality of conductive islands spaced from each other on a substrate, forming a photoresist film on the substrate, removing portions of the photoresist film and exposing the conductive islands through the removed portions, forming a conductive bump on each of the exposed islands, and removing the photoresist film remaining on the substrate.

In another aspect of the method for fabricating a package including a substrate having inner leads, a die pad, a chip, wires, a molding unit, and an external terminal, the method comprises the steps of forming a plurality of conductive islands spaced from each other on a substrate, forming a photoresist film on the substrate, removing portions of the photoresist film and exposing the conductive islands through the removed portions, forming a conductive bump on each of the exposed islands, removing the photoresist film remaining on the substrate, forming a die pad on a surface of the substrate, attaching a chip on the die pad, connecting the chip to the inner leads with wires, and forming a molding unit surrounding the chip and wires and covering a portion of the substrate.

In a further aspect, the method for fabricating a semiconductor package includes the steps of forming a plurality of conductive elements on a substrate, forming a mask having a pattern corresponding to the conductive elements, the mask exposing the conductive elements, and forming a plurality of conductive bumps on the conductive elements using the mask.

In a further aspect of the method for fabricating a package including a substrate having inner leads, a die pad, a chip, wires, a molding unit, and an external terminal, the method includes the steps of forming a plurality of conductive elements on a substrate, forming a mask having a pattern corresponding to the conductive elements, the mask exposing the conductive elements, forming a plurality of conductive bumps on the conductive elements using the mask, forming a die pad on a surface of the substrate, attaching a chip on the die pad; connecting the chip to the inner leads with wires, and forming a molding unit surrounding the chip and wires and covering a portion of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

With reference to the accompanying drawings, the external terminal fabrication method for a BGA package will be described.

Figure 2A:
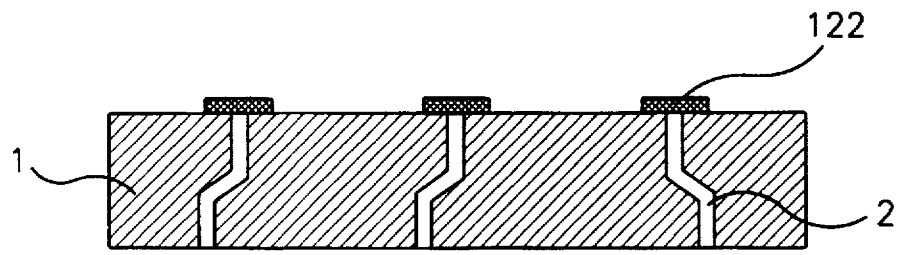
FIGS. 2A through 2F illustrate a method for forming a substrate for a BGA package according to a first embodiment of the present invention.

As shown in FIGS. 2A–2F, a ready-made PCB substrate 1 is provided having a plurality of inner leads 2 therethrough. As shown in FIG. 2A, a plurality of copper islands 122 having a thickness of about 10–50 μm are formed on the upper surface of substrate 1, where inner leads 2 are exposed using a known circuit pattern forming process of a PCB.

Figure 2B:
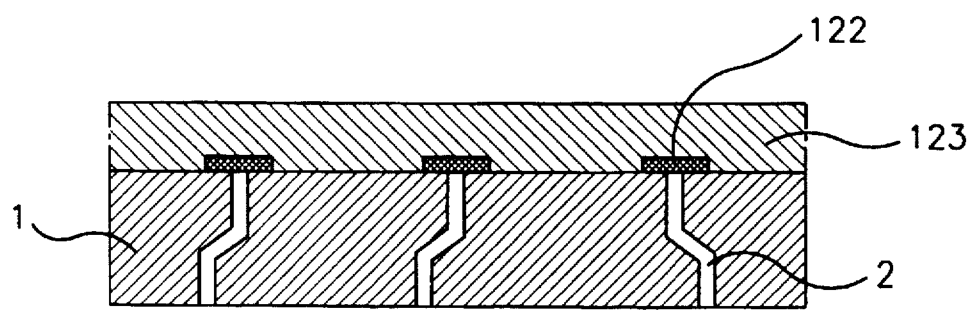
Figure 2C:
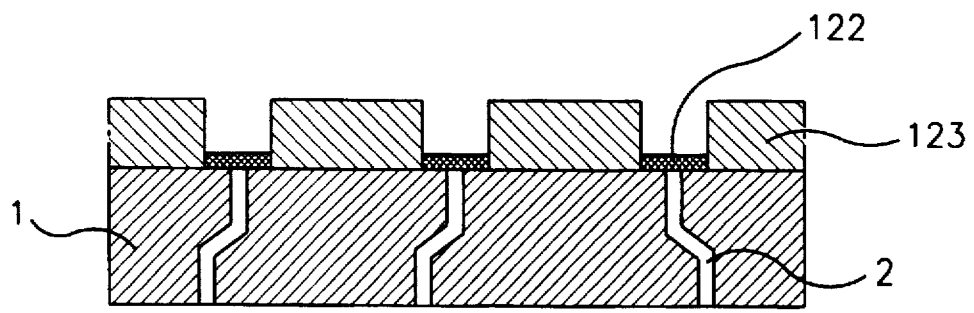

Next, as shown in FIG. 2B, on top of substrate 1 having copper islands 122 thereon, a photoresist film 123 is spread with a thickness of preferably 50–100 μm. Then, as shown in FIG. 2C, portions of the photoresist film 123 overlying copper islands 122 is removed by photolithographic process, to thereby expose copper islands 122 therethrough.

Figure 2D:
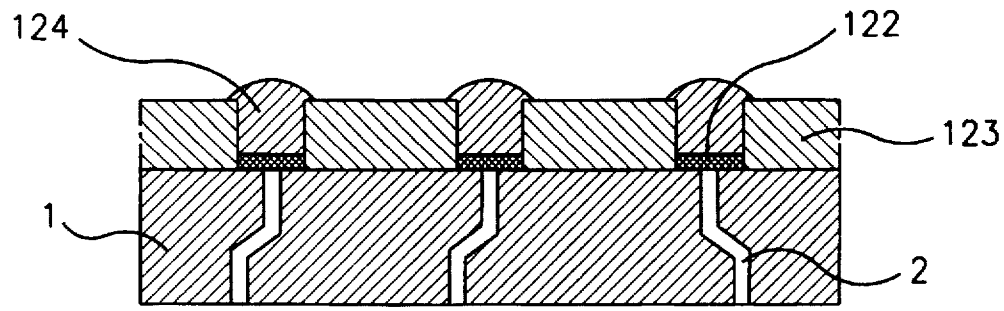

As shown in FIG. 2D, a copper layer is plated on the exposed copper islands 122 to form a plurality of bump members 124 preferably using a non-electrolytic plating process. At this time, when a pitch between the external terminals is about 1.27 mm, for example, the diameter for bump members 124 is formed to be preferably 250–700 μm to prevent adjacent bump members 124 from bridging. Also, considering a lowered mounting height after bump melting under an appropriate mounting temperature when mounting the completed BGA package, the height of bump members 124 is preferably 100–700 μm. The height of bump members 124 can be controlled in accordance with the reaction time based upon the plating reaction speed.

Figure 2E:
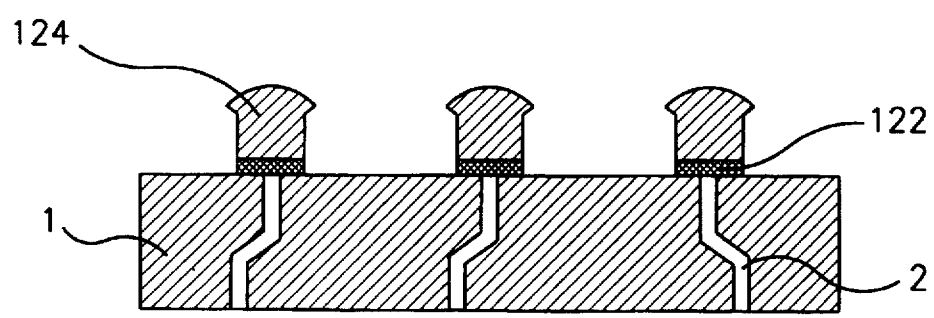
Figure 2F:
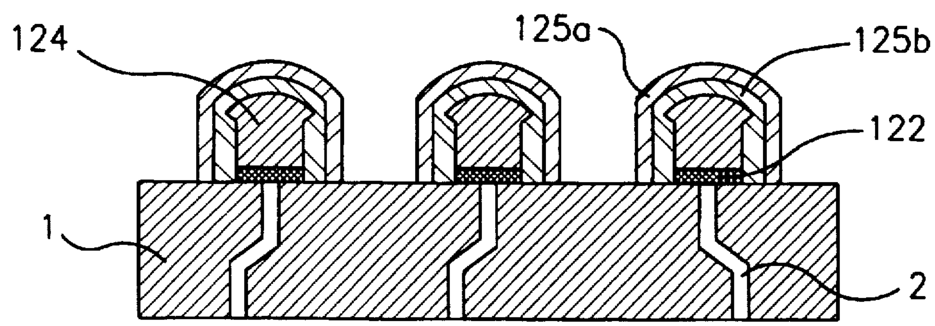

As shown in FIG. 2E, the remaining photoresist film 123 is removed from substrate 1. As shown in FIG. 2F, a nickel (Ni) layer **125*b* is plated on the surface of the copper bump members 124 to a thickness of preferably about 5–30 μm. On top of the plated Ni layer 125*b*, a gold (Au) layer 125*a*** is plated to a thickness preferably of less than 5 μm in order to improve adhesion when mounting on a PCB (not shown).

Figure 1:
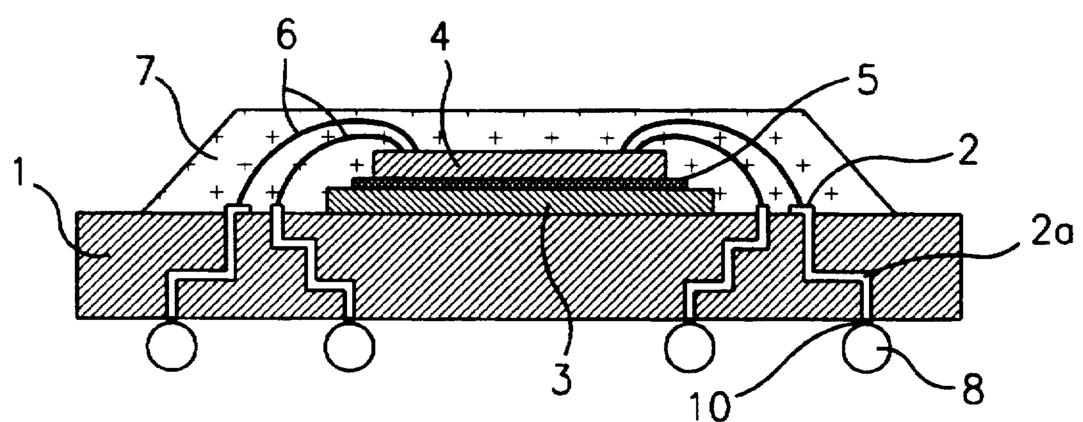
FIG. 1 is a schematic cross-sectional view of a conventional BGA package.

Thus, bump members 124 serving as external terminals for a BGA package are formed. On an opposite side of substrate 1, a die paddle 3 is mounted, on which is spread an adhesive 5 (see FIG. 1) and a die bonding is then performed for attaching a chip 4 thereon. A wire bonding step is carried out to connect the bonding pads of the chip 4 to the bonding fingers **2*a* at the respective end portions of inner leads 2 with metal wires 6. The chip 4 and the external terminals 8 are electrically connected and an epoxy compound is molded to surround metal wires 6 and chip 4**, thus completing the BGA package fabrication.

Figure 3A:
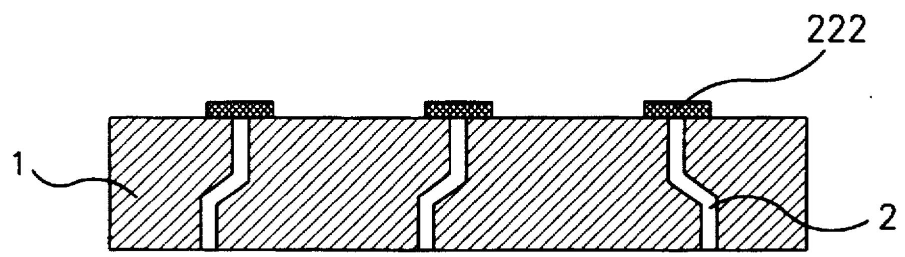
FIGS. 3A through 3F illustrate a method for forming a substrate for a BGA package according to a second embodiment of the present invention.
Figure 3B:
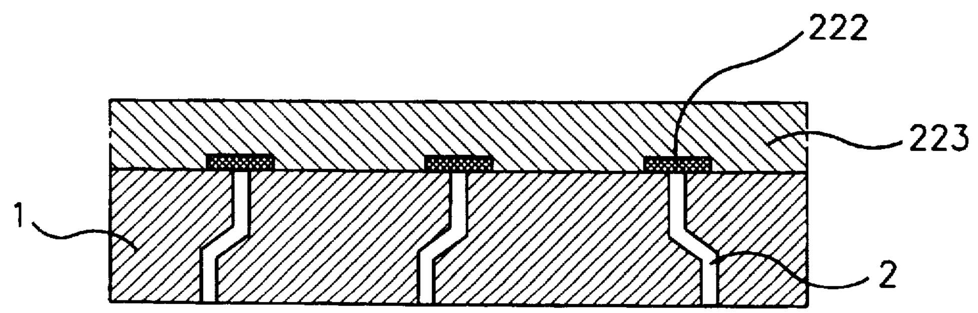
Figure 3C:
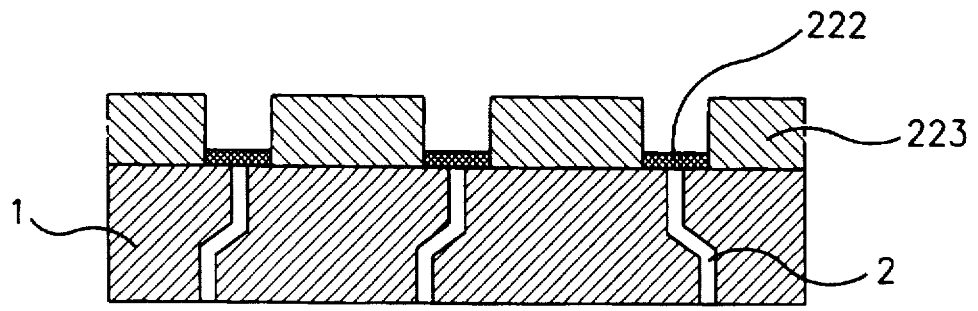
Figure 3D:
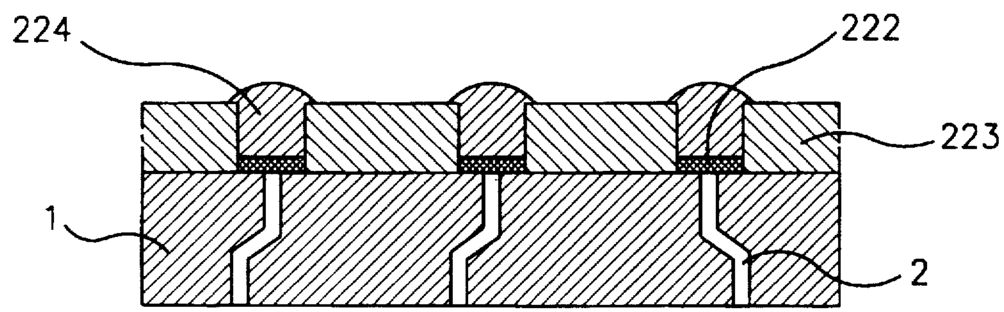
Figure 3E:
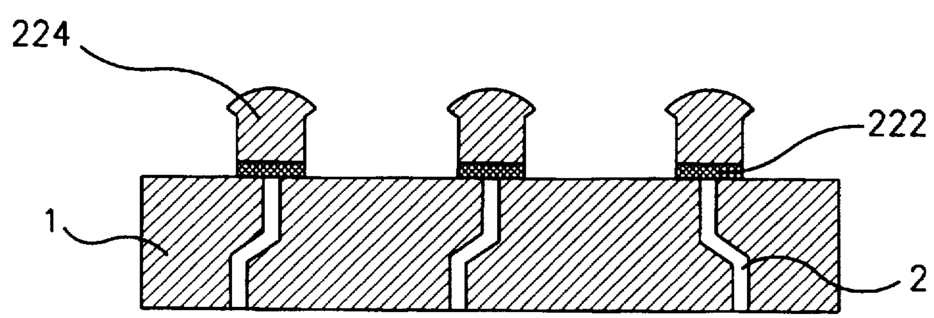
Figure 3F:
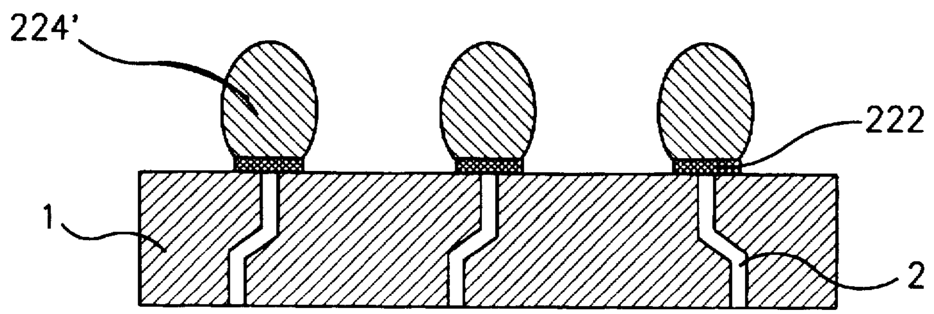

An external terminal fabrication method for a BGA package according to a second embodiment of the present invention is shown in FIGS. 3A–3F. Referring to FIGS. 3A–3F, a plurality of copper islands 222 are formed on a substrate 1 having a plurality of inner leads 2 therethrough, by using a known PCB pattern forming process (FIG. 3A). A photoresist film 223 is formed on substrate 1 (FIG. 3B). The portions of photoresist film 223 which are formed over copper islands 222 are removed using a photolithographic process to expose islands 222 therethrough (FIG. 3C). A solder is plated on the exposed copper islands 222 to form bump members 224 (FIG. 3D). The remaining photoresist film on the substrate 1 is entirely removed (FIG. 3E), and the solder bump members 224 are preferably reflowed to form rounded ball shapes (FIG. 3F).

Substrate 1 is desirably formed of a PCB or a ceramic material having a melting point of preferably more than 300° C. When mounting, the bump height of the solder bump members 224 becomes lowered under a mounting temperature. Hence, it is preferable to employ a solder having a ratio of Sn to Pb of about 90:10 to 80:20, respectively, and a higher melting point rather than a solder paste (ratio of Sn to Pb is 63 to 37) to thereby prevent bridging between adjacent terminals.

As described above, in the external terminal fabrication method for a BGA package according to the present invention, a ball forming process is adopted, so that a conventional ball mounting process can be omitted. This eliminates fault elements such as a faulty connection between internal and external terminals due to inaccurate matching or alignment in the ball mounting process, or the partial detachment of external leads due to poor adhesion between the substrate and solder balls, thereby enhancing productivity in the semiconductor package fabrication. Moreover, by eliminating the need to a high priced ball mounting device, the semiconductor package according to the present invention can be fabricated at a lower cost.

Accordingly, the ball grid array (BGA) package of the present invention eliminates the need for a ball mounting step by plating bumps directly on a substrate when forming external terminals serving as the balls for the BGA package.

It will be apparent to those skilled in the art that various modifications and variation can be made in the external terminal fabrication method for semiconductor device package of the present invention without departing from the spirit or scope of the invention. Thus, it is intended that the present invention cover the modifications and variations of this invention provided they come within the scope of the appended claims and their equivalents.

What is claimed is:

1. A method of fabricating an external terminal for a ball grid array (BGA) semiconductor package including a substrate having first and second sides, the method comprising the steps of:

forming a plurality of conductive islands spaced from each other on the first side of the substrate;

forming a photoresist film on the first side of the substrate;

removing portions of the photoresist film to expose the conductive islands through the removed portions;

forming a conductive bump on each of the exposed islands for serving as the external terminal, each conductive bump directly contacting the conductive islands; removing the photoresist film remaining on the first side of the substrate; and forming a chip on the second side of the substrate, the second side of the substrate being the opposite side to the first side of the substrate.

2. The method according to claim 1, wherein the conductive bump is formed by a non-electrolytic plating process.

3. The method according to claim 1, wherein the conductive islands are formed of copper.

4. The method according to claim 1, wherein the conductive bump is formed to be about 100~700 μm in height and about 250~700 μm in diameter.

5. The method according to claim 1, wherein the conductive bump is formed of copper.

6. The method according to claim 1, further comprising the step of forming nickel layer and gold layer sequentially on the conductive bump.

7. The method according to claim 1, further comprising the step of forming a nickel layer on an exposed surface of the bump.

8. The method according to claim 7, further comprising the step of forming a gold layer on the nickel layer.

9. The method according to claim 8, wherein the nickel layer and the gold layer are formed by a plating process.

10. The method according to claim 1, wherein the bump is formed of a solder.

11. The method according to claim 10, further comprising the step of performing a reflow process after forming the bump.

12. The method according to claim 10, wherein the substrate is formed of one of a printed circuit board and a ceramic, having a melting point of more than 300° C.

13. The method according to claim 10, wherein the bump is formed to have a ratio of Sn:Pb in a range from about 90:10 to 80:20.

14. A method of fabricating a package including a substrate having inner leads, a die pad, a chip, wires, a molding unit, and an external terminal, the method comprising the steps of:

forming a plurality of conductive islands spaced from each other on a first side of the substrate, each conductive islands contacting the inner leads;

forming a photoresist film on the first side of the substrate;

removing portions of the photoresist film and exposing the conductive islands through the removed portions;

forming a conductive bump on each of the exposed islands;

removing the photoresist film remaining on the first side of the substrate;

forming the die pad on a surface of a second side of the substrate, the second side of the substrate being the opposite side to the first side of the substrate;

attaching the chip on the die pad;

connecting the chip to the inner leads with wires; and forming a molding unit surrounding the chip and wires and covering a portion of the second side of the substrate.

15. The method according to claim 14, wherein the conductive bump is formed by a non-electrolytic process.

16. The method according to claim 14, wherein the conductive islands are formed of copper.

17. The method according to claim 14, wherein the conductive bump is formed to be about 100~700 μm in height and about 250~700 μm in diameter.

18. The method according to claim 14, further comprising the step of forming a nickel layer on an exposed surface of the bump.

19. The method according to claim 18, further comprising the step of forming a gold layer on the nickel layer.

20. The method according to claim 14, wherein the bump is formed of a solder.

21. The method according to claim 20, further comprising the step of performing a reflow process after forming the bump.

22. The method according to claim 20, wherein the substrate is formed of one of a printed circuit board and a ceramic, having a melting point of more than 300° C.

23. The method according to claim 20, wherein the bump is formed to have a ratio of Sn:Pb in a range from about 90:10 to 80:20.

24. A method of fabricating a semiconductor package including a substrate having inner leads, the method comprising the steps of:

forming a plurality of conductive elements on a first side of the substrate, each conductive islands contacting the inner leads;

forming a mask having a pattern corresponding to the conductive elements, the mask exposing the conductive elements;

forming a plurality of conductive bumps on the conductive elements using the mask for serving as external terminals, the conductive bumps directly contacting the conductive elements; and forming a chip on a second side of the substrate, the second side of the substrate being the opposite side to the first side of the substrate.

25. The method according to claim 24, further comprising the steps of:

forming a die pad on a surface of the substrate;

attaching a chip on the die pad;

connecting the chip to the inner leads with wires; and forming a molding unit surrounding the chip and wires and covering a portion of the substrate.

26. The method according to claim 1, wherein the external terminal has a pitch of about 1.27 mm.

27. The method according to claim 14, wherein the external terminal has a pitch of about 1.27 mm.

28. The method according to claim 24, wherein the external terminals have a pitch of about 1.27 mm.

* * * * *